United States Patent [19]

Matsushima et al.

[11] Patent Number: 4,761,383
[45] Date of Patent: Aug. 2, 1988

[54] METHOD OF MANUFACTURING AVALANCHE PHOTO DIODE

[75] Inventors: Yuichi Matsushima, Tokorozawa; Kazuo Sakai; Shigeyuki Akiba, both of Tokyo, all of Japan

[73] Assignee: Kokusai Denshin Denwa Kabushiki Kaisha, Tokyo, Japan

[21] Appl. No.: 47,606

[22] Filed: Apr. 30, 1987

Related U.S. Application Data

[60] Division of Ser. No. 774,301, Sep. 10, 1985, abandoned, which is a continuation of Ser. No. 421,801, Sep. 23, 1982, abandoned.

[30] Foreign Application Priority Data

Sep. 28, 1981 [JP] Japan .................. 56-152048

[51] Int. Cl.$^4$ ............................... H01L 31/18
[52] U.S. Cl. .................. 437/3; 357/13; 357/30; 437/5
[58] Field of Search .......... 437/3, 5; 357/13, 30 A

[56] References Cited

U.S. PATENT DOCUMENTS

| | | | |
|---|---|---|---|
| 4,125,415 | 11/1978 | Clark | 357/13 |
| 4,153,904 | 5/1979 | Tasch et al. | 357/13 |
| 4,481,523 | 11/1984 | Osaka et al. | 357/13 |
| 4,651,187 | 3/1987 | Sugimoto et al. | 357/30 |

FOREIGN PATENT DOCUMENTS

| | | | |
|---|---|---|---|
| 56-42385 | 4/1981 | Japan | 437/3 |
| 57-26486 | 2/1982 | Japan | 437/3 |
| 59-123282 | 7/1984 | Japan | 357/30 |
| 1441261 | 6/1976 | United Kingdom | 357/13 |

OTHER PUBLICATIONS

Nishida et al, "InGaAsP Heterostructure . . . Gain", *Appl. Phys. Lettr.*, 35(3), Aug. 1, 79, pp. 251–253.
Shirai et al, "1.3 μm InP/InGaAsP . . . Photodiodes", *Elect. Lettr.* Oct. 29, 1981, vol. 17, No. 22, pp. 826–827.
Teguchi et al, "InP–InGaAsP . . . Effect", *Elect. Lettr.*, Jul. 19, 1979, vol. 15, No. 15, pp. 453–455.

*Primary Examiner*—Aaron Weisstuch
*Attorney, Agent, or Firm*—Emanuel J. Lobato; Robert E. Burns

[57] ABSTRACT

An avalanche photo diode in which the guard ring portion and the front of the pn junction of the light receiving portion are formed at the same depth from the surface of an InP layer, so that the guard ring performs its desired function.

3 Claims, 3 Drawing Sheets

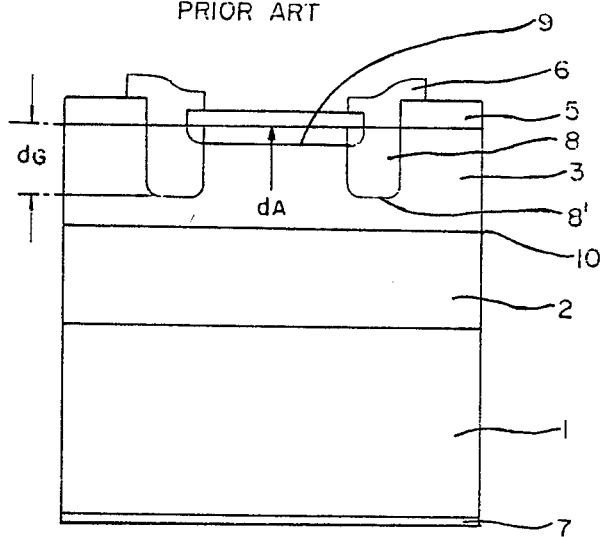
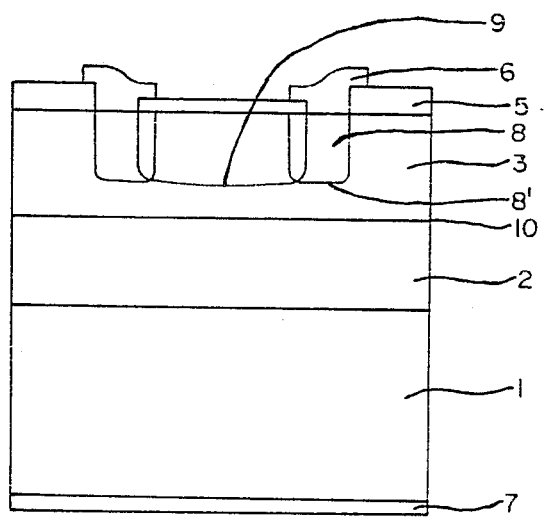

METHOD OF MANUFACTURING AVALANCHE PHOTO DIODE

This is a divisional application of our application, Ser. No. 06/774,301 filed Sept. 10, 1985, now abandoned, and which is a continuation of our application, Ser. No. 421,801, filed Sept. 23, 1982, now abandoned.

BACKGROUND OF THE INVENTION

The present invention relates to a high-speed, high-sensitivity and low-noise semiconductor photodetector for use in optical communication equipments, and more particularly to a high reliability planar avalanche photodiode (hereinafter referred to as an APD) which is provided with a pn junction having what is called a guard ring and manufacturing method thereof.

It is well-known that an APD is very important as a high-speed, high sensitivity photo-detector needed in optical communication systems and the like. At present, a Si-APD formed of a Si crystal is widely employed in optical communications using a GaAs-AlGaAs laser of about 0.8 μm wavelength. With a photo-detector using the Si crystal, however, it is difficult to detect light of a wavelength longer than 1 μm, and it cannot be employed over a wavelength range of 1.0 to 1.7 μm in which the transmission loss of silica fibers is low. As a photo detector sensitive to light of the 1 μm wavelength band, there has been proposed a Ge-APD using a Ge crystal, but it is not satisfactory because of a large dark current and excess noise. Therefore, an APD which has high sensitivity characteristics in the 1 μm wavelength range, using a semiconductor crystal of a III-V compound, is now being developed.

Materials for a photo-detector for the 1.0 to 1.7 μm range are InGaAs, InGaAsP, AlGaAsSb, GaSb and so forth. A pn junction is formed in such a material and a reverse bias voltage is applied to the junction and, at the same time, light is applied to the photo detector from one side, thereby to detect a current resulting from photo-electric conversion. When a function of absorbing light to generate photo carriers and a function of multiplying the generated photo carriers are provide in a semiconductor layer of the same composition, since these semiconductor materials have a small forbidden band width, a generation-recombination current component and a tunnel current component in the depletion layer increases upon application of the reverse bias, making it difficult to achieve low noise and high multiplication factor. With a view of overcoming the above-said defect, there has been proposed an APD of such a construction in which a light absorption region and a multiplication region are isolated from each other and the pn junction is provided in a different semiconductor of larger forbidden band, disposed adjacent the light absorbing layer, that is, a hetero structure APD (hereinafter referred to as an HAPD), as set forth in U.S. Pat. No. 4,274,103 and U.S. patent application Ser. No. 573,959, filed Feb. 21, 1984. For making the HAPD highly reliable, it is desired to employ a planar structure provided with a guard ring.

However, the guard ring of a conventional HAPD does not have sufficient functions as mentioned below.

BRIEF SUMMARY OF THE INVENTION

An object of the present invention is to provide an avalanche photo diode of such an arrangement that the guard ring portion and the front of the pn junction of the light receiving portion are formed at the same depth from the surface of the InP layer, that is, at the depth $d_G \simeq d_A$, to overcome the aforesaid defect of the HAPD with a guard ring, and the guard ring sufficiently performs its function, and a method for the manufacture of such an avalanche photo diode.

To attain the above object of the this invention, there is provided an avalanche photo diode which comprises a semiconductor substrate of a first conductivity type; a first semiconductor layer of the first conductivity type formed on the semiconductor substrate and serving as a light absorbing layer; a second semiconductor layer of the first conductivity type formed on the first semiconductor layer and having a larger forbidden band width; and a region of a second conductivity type, formed in the second semiconductor layer, and in which a pn junction centrally of the region serves as a light receiving region, a metal electrode, and a guard ring are provided around the light receiving region, characterized in that the distances from the hetero boundary between the first semiconductor layer and the second semiconductor layer to the front of the guard ring and to the front of the pn junction serving as the light receiving region are substantially equal to each other.

In accordance with the present invention, there is provided a method for the manufacture of an avalanche photo diode, comprising the steps of: forming, on a semiconductor substrate of a first conductivity type, at least a first semiconductor layer of the first conductivity and serving as a light absorbing layer, a second semiconductor layer of the first conductivity type and having a larger forbidden band width, and a dummy layer of the first conductivity type; forming, by diffusion, a ring-shaped region of the second conductivity type to extend through the dummy layer down to the second semiconductor layer, the ring-shaped region being used as a guard ring; removing the dummy layer; forming, by diffusion, a light receiving region of the second conductivity type in the second semiconductor layer inside the ring-shaped region and making the distances from the hetero boundary between the first semiconductor layer and the second semiconductor layer to the front of the guard ring and to the front of the pn junction serving as the light receiving region substantially equal to each other; and providing electrodes on the substrate and the guard ring.

BRIEF DESCRIPTION OF THE DRAWINGS

The present invention will be described in detail below in comparison with the prior art with reference to the accompanying drawings, in which:

FIG. 1 is a longitudinal sectional view illustrating an example of a hetero structure avalanche photo-diode with a guard ring produced by a prior art method;

FIG. 2 is a longitudinal sectional view illustrating an embodiment of the present invention.

DETAILED DESCRIPTION

Figure 3A:
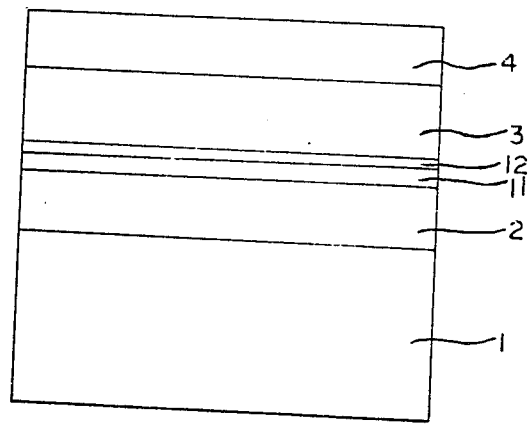
FIGS. 3A, 3B, 3C, and 3D are longitudinal sectional views explanatory of steps involved in the manufacture of the embodiment of the present invention.

For ready understanding of the present invention, an example of the prior art will first be described.

FIG. 1 is a cross-sectional view of a planar HAPD of InP-In$_{0.53}$Ga$_{0.47}$As employing a guard ring structure heretofore used in the Si-APD, Ge-APD and so forth. In FIG. 1, reference numeral 1 indicates an n type InP (100) substrate, the impurity concentration of which is $1 \times 10^{18}$ cm$^{-3}$. On the substrate 1, an n type light absorbing layer 2 formed of In$_{0.53}$Ga$_{0.47}$As and having an impurity concentration of 1 to $2 \times 10^{16}$ cm$^{-3}$ and an n type InP layer 3 having an impurity concentration of 1 to $2 \times 10^{16}$ cm$^{-3}$ are formed to form a heterojunction 10 therebetween by vapor phase epitaxy, molecular beam epitaxy or the vapor phase deposition method using an organic metal. Next, a guard ring 8 and a pn junction 9 of the light receiving portion are formed through diffusion of Zn or Cd. Since the breakdown voltage of the guard ring 8 must be higher than that of the pn junction 9 of the light receiving portion, the guard ring is formed by a low-temperature, long-time diffusion or drive-in diffusion. With such an arrangement, the distance $d_G$ from the upper surface of the InP layer 3 to the diffusion front 8' of the guard ring 8 and the depth $d_A$ of the pn junction 9 of the light receiving portion from the upper surface of InP layer 3 bear the relation $d_A < d_G$. The HAPD must be designed so that when a reverse bias close to the breakdown voltage of the pn junction of the light receiving portion is applied, the electric field which is created is sufficient to drift photo generated carriers to the pn junction 9 in the InP layer 3 without rapidly increasing the tunnel current component in the light absorbing layer 2. However, when the depth $d_G$ of the guard ring is larger than the depth $d_A$ of the pn junction of the light receiving portion as shown in FIG. 1, the electric field applied to the light absorbing layer 2 below the guard ring becomes large due to an increase in the length of the depletion layer by the diffusion front 8' of the guard ring 8 at the time of applying the reverse bias, causing an increase in the tunnel current in the light absorbing layer below the guard ring.

With reference to the accompanying drawings, the present invention will hereinafter be described in detail.

FIG. 2 illustrates an example of the HAPD obtainable with the present invention. As is the case with FIG. 1, the light absorbing layer 2 of In$_{0.53}$Ga$_{0.47}$As and the InP layer 3 are sequentially grown on the InP substrate 1. It is difficult to grow the InP layer 3 directly on the In$_{0.53}$Ga$_{0.47}$As light absorbing layer 2 via liquid phase epitaxy, but a structure as proposed in U.S. patent application Ser. No. 573,959 in which one or two thin In$_{1-x}$Ga$_x$As$_y$P$_{1-y}$ ($0 < X < 1.0 < y < 1$) buffer layers are sandwiched between the light absorbing layer 2 and the InP layer 3 can be regarded as the same structure as shown in FIG. 1.

Next, a description will be given, with reference to FIGS. 3A-3D the drawings, of the manufacturing method of the planar HAPD of the present invention. An embodiment will now be described which employs liquid phase epitaxy and diffusion of Zn. At first, an n type In$_{0.53}$Ga$_{0.47}$As layer having an impurity concentration of 1 to $2 \times 10^{16}$ cm$^{-3}$ and a thickness of 3 $\mu$m, which will ultimately serve as the light absorbing layer 2, an n type In$_{0.60}$Ga$_{0.40}$As$_{0.91}$P$_{0.09}$ layer 11 and an n type In$_{0.74}$Ga$_{0.26}$As$_{0.60}$P$_{0.40}$ layer 12, each having an impurity concentration of 1 to $2 \times 10^{16}$ cm$^{-3}$ and a thickness of 0.1 to 0.2 $\mu$m, which will serve as buffer layers, an n type InP layer 3 having an impurity concentration of 1 to $2 \times 10^{16}$ cm$^{-3}$ and a thickness of 3 $\mu$m, which is provided for forming a pn junction, and an n type In$_{0.74}$Ga$_{0.26}$As$_{0.60}$P$_{0.40}$ layer having an impurity concentration of $2 \times 10^{16}$ cm$^{-3}$ and a thickness of 1 to 3 $\mu$m, which will serve as a dummy layer 4, are sequentially formed by liquid phase epitaxy on an n type InP substrate 1 having an impurity concentration of $1 \times 10^{18}$ cm$^{-3}$, as shown in FIG. 3A.

Figure 3B:
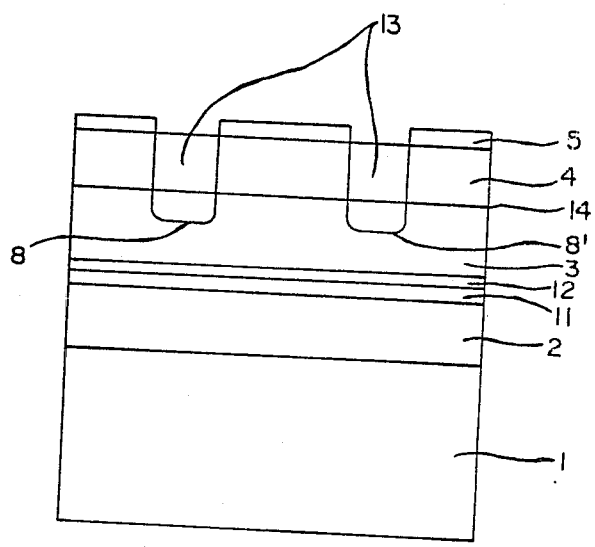

Next, as shown in FIG. 3B, a selective diffusion mask 5 of insulating material comprising Si$_3$N$_4$, SiO$_2$ or the like is deposited and the portion thereof which will form the guard ring is removed and then a diffused region 13 is formed by diffusing Zn, using ZnAs$_2$ or the like as a diffusion source. By effecting the diffusion at a temperature 450° to 500° C., an n$^-$ layer is formed at a diffusion front 8 and, in this case, the diffusion front 8' is disposed in the InP layer 3 at a distance of 1.5 to 2 $\mu$m from interface 14. The position control of the diffusion front 8' is dependent upon the diffusion temperature, the diffusion time and the thickness of the dummy layer 4. It is also possible to form a guard ring having a low-temperature diffusion front 8' in the InP layer 3 by confining the diffusion to the dummy layer 4 and drive-in diffusing Zn in the dummy layer 4 at a high temperature (600° C. or higher). The dummy layer 4 is capable of preventing thermal degradation of the wafer surface which often poses a problem in the manufacture of the planar HAPD especially when a final growth layer is an InP layer formed by the liquid phase growth method.

Next, the selective diffusion film 5 and the dummy layer 4 are removed through the use of a selective etchant, leaving some portions thereof for patterning.

Figure 3C:
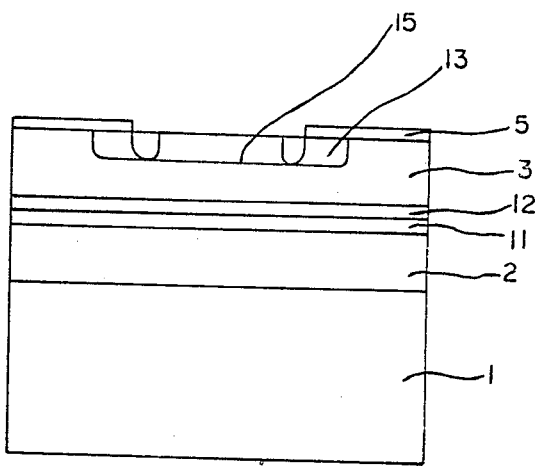
Figure 3D:
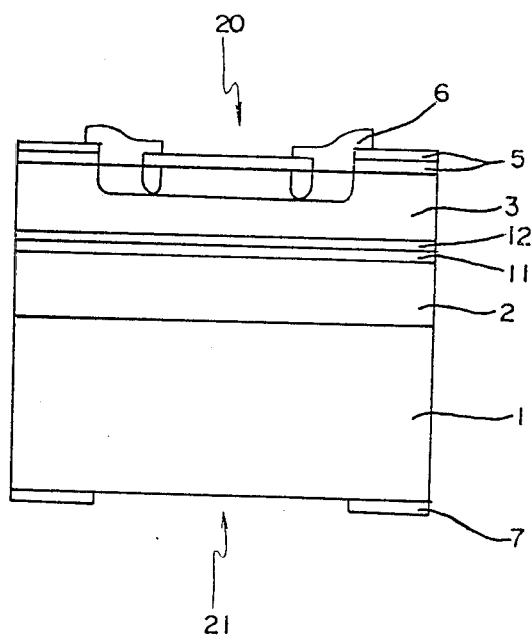

Further, as shown in FIG. 3C, a mask 5 of an insulating film of Si$_3$N$_4$, SiO$_2$ or the like as before described is deposited and then a hole is made in the portion which will ultimately act as the light receiving portion. Thereafter, Zn is diffused into the InP layer 3 to form the pn junction 15 of the light receiving portion, the diffusion being carried out at 550° to 600° C. so that the guard ring and the diffusion front may be formed at the same depth and that no front of the n$^-$ layer may be formed. By this, the light receiving portion and the guard ring portion 13 of different carrier gradients are formed at the diffusion front although the diffusion front is of the same depth as the guard ring. Thus, it is possible to obtain an HAPD in which a local breakdown in the vicinity of the light receiving portion is suppressed at the time of applying a reverse bias and, also when a depletion layer extends to the light absorbing layer, an increase in the tunnel current component by the electric field in the guard ring portion is small. FIG. 3D shows the device, having layers similar to 3C, after a p electrode 6 and an n electrode 7 were provided on the diffusion and substrate sides, respectively. By suitable selection of the electrode arrangement used, light can be applied from the side of the p electrode 6 or the substrate 1 as indicated by 20 and 21. And light of a 1.0 to 1.7 $\mu$m wavelength can be received by the light absorbing layer 2.

Moreover, the In$_{0.53}$Ga$_{0.47}$As light absorbing layer 2 may also be of In$_x$Ga$_{1-x}$As$_{1-y}$P$_y$ ($0 < x < 1$, $0 \leq y < 1$). The same effect as described above can also be obtained by the diffusion of Cd.

In the foregoing, the present invention has been described as being applied to an HAPD of InP-InGaAsP material, and it is evident that the present invention is effective for improvement of the breakdown characteristics of an APD using a heterojunction and can also be applied to other III-V compound semiconductors such as GaAs-AlGaAs, GaSb-AlGaAsSb and so forth.

As has been described in the foregoing, according to the present invention, it is possible to obtain a planar type, hetero structure avalanche photo-diode which has a uniform breakdown characteristic over the entire light receiving plane and is small in dark current and excellent in multiplication characteristic; therefore, the present invention is of extremely great industrial value.

What we claim is:

1. A method for the manufacture of an avalanche photo-diode, comprising the steps of: forming in sequence, on a semiconductor substrate of a first conductivity type, at least a first semiconductor layer of the first conductivity type and serving as a light absorbing layer, a second semiconductor layer of the first conductivity type having a larger forbidden band width and forming a hetero boundary with said first layer, and a dummy layer of the first conductivity type; forming, by diffusion, a ring-shaped region of the second conductivity type to extend through the dummy layer down to the second semiconductor layer, the ring-shaped region being used as a guard ring; removing the dummy layer; forming, by diffusion, a light receiving region of the second conductivity type constituting a pn junction in the second semiconductor layer inside the ring-shaped region, making the distances from said hetero boundary between the first semiconductor layer and the second semiconductor layer to the diffusion front of the guard ring and to the pn junction serving as the light receiving region substantially equal to each other; and providing electrodes on the substrate and the guard ring.

2. A method of manufacturing an avalanche photo diode, comprising the sequential steps of forming on a semiconductor substrate a first semiconductor layer of the first conductivity type serving as a light absorbing layer, forming on said first semiconductor layer a second semiconductor layer of the first conductivity type having a larger forbidden band width and constituting a hetero boundary with said first layer; forming on said second semiconductor layer a region of a second conductivity type in which a pn junction located centrally of the region serves as a light receiving region, and providing a metal electrode and a guard ring around said light receiving region, the distances from said hetero boundary between the first semiconductor layer and the second semiconductor layer to the diffusion front of the guard ring and to the pn junction serving as the light receiving region being substantially equal to each other.

3. A method according to claim 2, in which said guard ring is provided by forming on said second semiconductor layer a dummy layer of the first conductivity type, forming a ring-shaped region of the second conductivity type to extend through the dummy layer down to the second semiconductor layer and removing the dummy layer.

* * * * *